US005825037A

United States Patent [19]

Nablo

[11] Patent Number: 5,825,037

[45] Date of Patent: Oct. 20, 1998

[54] COMPACT, SELFSHIELDED ELECTRON BEAM PROCESSING TECHNIQUE FOR THREE DIMENSIONAL PRODUCTS

[75] Inventor: Samuel V. Nablo, Lexington, Mass.

[73] Assignee: Electron Processing Systems, Inc., N. Billerica, Mass.

[21] Appl. No.: 658,882

[22] Filed: May 30, 1996

[51] Int. Cl.$^{6}$ .......... H01J 37/30

[52] U.S. Cl. .......... 250/492.3

[58] Field of Search .......... 250/492.3, 492.1

[56] References Cited

U.S. PATENT DOCUMENTS

| | | | |
|---|---|---|---|
| 3,104,321 | 9/1963 | Smith | 250/492.3 |
| 4,048,504 | 9/1977 | Bosshard | 250/492.3 |
| 4,246,297 | 1/1981 | Nablo et al. | 250/492.3 |
| 4,507,265 | 3/1985 | Higo et al. | 250/492.3 |
| 4,633,611 | 1/1987 | Schiller et al. | 250/433 |
| 5,434,421 | 7/1995 | Burth et al. | 250/492.3 |

OTHER PUBLICATIONS

Guideline for Electron Beam Radiation Sterilization of Medical Devices; ANSI/AAMI ST31–1990.

Radiat.Phys.Chem. vol. 42, Nos. 4–6,pp. 761–764, 1993.

Nuclear Instruments and Methods 94 (1971) pp. 509–513.

Revue Phys. Appl. 20 (1985) pp. 823–829.

Revue Phys. Appl. 22 (1987) pp. 1189–1200.

*Primary Examiner*—Bruce Anderson

*Attorney, Agent, or Firm*—Nields, Lemack & Dingman

[57] ABSTRACT

A compact, selfshielded electron beam processing technique for three dimensional products includes a treatment zone bounded by at least one material of high atomic number. Energetic electrons are directed into the treatment zone in such a manner that electron reflection from the boundary of the treatment zone assists in filling the treatment zone with energetic electrons. The products to be treated are caused to travel through the treatment zone without any mechanical contact therewith (such as by ballistic or pneumatic techniques).

13 Claims, 8 Drawing Sheets

GEOMETRY OF CONTACTLESS STERILIZATION TECHNIQUE.

GEOMETRY OF CONTACTLESS STERILIZATION TECHNIQUE.

COMPACT, SELFSHIELDED ELECTRON BEAM PROCESSING TECHNIQUE FOR THREE DIMENSIONAL PRODUCTS

BACKGROUND OF THE INVENTION

1. Field of the Invention

The invention relates to electron processing. There are many embodiments of the use of energetic electrons for the modification or treatment of matter. Of particular interest for the process taught here is the surface modification or sterilization of matter. For a solid object, this might require penetration of only a few microns below the surface, typically well beyond the surface connected pore structure of the hydrocarbon for sterilization or surface modification if a polymer is the material of interest.

Treatment requirements are determined by the energy investment per unit mass of the product required to accomplish the desired effect. This is usually stated in units of joules/kg using the International Unit of absorbed dose: namely, the Gray, which is 100 rads or 1 joule/kg. Most electron "initiated" processes require 1–50 kGy of treatment (0.1–5 Megarads). Depending upon the electron energy used and hence, depth of penetration, this treatment level or dose can be related directly to the electron fluence (flux×time) in electrons/cm$^2$ received by the surface of the product. For example, at low energies, 10 kGy or 1 Megarad of dose will be delivered by an electron surface fluence of one microcoulomb/cm$^2$ of surface area.

The technique taught here is that of providing a uniform and predictable fluence around a dynamic object with a unilaterally directed electron beam. In fact, the electron processor system is usually controlled on the basis of its known (measured) delivery efficiency or yield, usually quoted as a machine constant k in units of kiloGray meters/min./ma. Once this figure of merit is known for a processor geometry, the dose delivered D can be calculated with a knowledge of the product velocity v while in the processor and of the machine current I, where $D=kI/v$.

The transit velocity of the product in the processor is typically controlled by a supporting mechanical conveyor or by the transport velocity of the product itself, if it is film or web for example.

2. Description of the Related Art

One of the prerequisites of aseptic or sterile processing is that all surfaces exposed to the sterile environment must be bioburden free. For example, in the sterile packaging of foodstuffs or medical products into open mouthed containers, it is essential that not only the product contact surfaces be sterile, but that the non-contact surfaces of the container be sterile so that no contamination can reach those ultimately sealed-off surfaces of the container through convective mixing, contamination through contact, etc.

Any sterilizing agent, such as the low energy electrons, can easily be blocked from a container surface by thin grippers, belts or planchets with which it may be in contact. As a result, some dynamic manipulation of the container may be required to assure treatment of "occluded" areas of the surface, a procedure difficult to implement in high speed processes. An alternative approach is bilateral treatment either simultaneous or sequential, which is usually impracticable..

The geometry taught here greatly simplifies the uniform treatment of three dimensional devices with energetic electrons through the use of contactless presentation of the product to the flux of energy available in the electron stream. In principle, contactless presentation of an object to the electron beam can be accomplished by suspension and translation of the device in an air stream. However, access to all surfaces by the electrons is difficult to achieve, particularly with a unilateral source, in that sufficient separation of the product from the surrounding walls must be achieved to permit electron access to the surfaces, particularly those on opposite sides of the object to those surfaces directly illuminated. In addition, the control of a product in pneumatic transport is difficult for the contoured, molded surfaces in the objects of interest. Precise control of residence time in the electron beam is mandatory for process quality assurance and must rely upon a "fail:safe" transport technique, especially for "regulated" processes such as sterilization. Other techniques of product support such as magnetic levitation are too complex and generally totally ineffective for the nonmagnetic polymers of primary interest for either electron surface modification or sterilization.

Supporting devices which could provide product orientation in the electron beam so that "all" surfaces receive comparable fluence of energy during transit through the beam or during static "start:stop" exposure, are too difficult to implement. The major difficulty is in time of exposure, in that residence times in the beam for most practical industrial applications are less than one second, so that the controlled manipulation of the product with robotics during transit, in times of a few hundred milliseconds, becomes impractical.

Some sterilizing agents such as gamma-rays, x-rays or very high energy electrons, can provide full penetration of a container or of a molded component such as a cap, or an exit or entry fitment on a bag for sterile products, such as a wedge or needle port. Unfortunately, these energy sources are usually very large and vault shielded, so that it is impractical to incorporate them into the aseptic container manufacturing and/or filling system. In practice, these components are sterilized in biobarrier bags at a central facility and the sealed bags taken to the manufacturing/filling machine. There they must be introduced to the machine by entrance through a sterile port which permits handling of the pre-sterilized components under aseptic conditions. This is a difficult procedure and usually involves a chemically sterilized adaptation port and very complex handling procedures with performance difficult to verify.

SUMMARY OF THE INVENTION

An electron beam irradiation geometry is taught which provides a uniform, isotropic irradiation of components which are to be sterilized or bulk/surface modified using energetic electron sources. In principle, the technique uses a side fired beam directed into a radiation cavity whose longitudinal axis of symmetry is oriented along the earth's gravitational vector, i.e. is vertical. In operation, the products are individually dropped into the "hohlraum", now filled with energetic electrons, and the average product velocity under free-fall can be matched to the dose rate in the cavity so that the product of dose rate and exposure time in the cavity will provide the necessary treatment of the product. Product entrance and exit velocities are controlled by the ballistics (free-fall distance) of the product into the irradiation chamber or cavity. The product is untouched (mechanically) during irradiation permitting uniform treatment of small or large products of complicated geometries which would otherwise require impractically complex handling in order to ensure complete surface treatment (e.g. as in the sterilization application). This problem arises from the limited penetration capability of electrons at the energies of interest; e.g. only a few hundred microns of material,— thicknesses which are typical of the grippers used to manipulate such low mass products.

BRIEF DESCRIPTION OF THE DRAWINGS

The invention may best be understood from the following detailed description thereof, having reference to the accompanying drawings, in which.

DESCRIPTION OF THE PREFERRED EMBODIMENTS

Contactless Device Transport in the Cavity

The ballistic transport of a product, for example powders and particulate matter, is rarely used in electron processing because the velocities achievable are of little interest for mass transport where high throughput is essential to attractive process economics. This is no longer a problem with product sterilization, particularly for in-line treatment of package fitments of discrete three dimensional products. Here process rates of a few per second are typical so that elevated process speeds are unnecessary.

Figure 1:
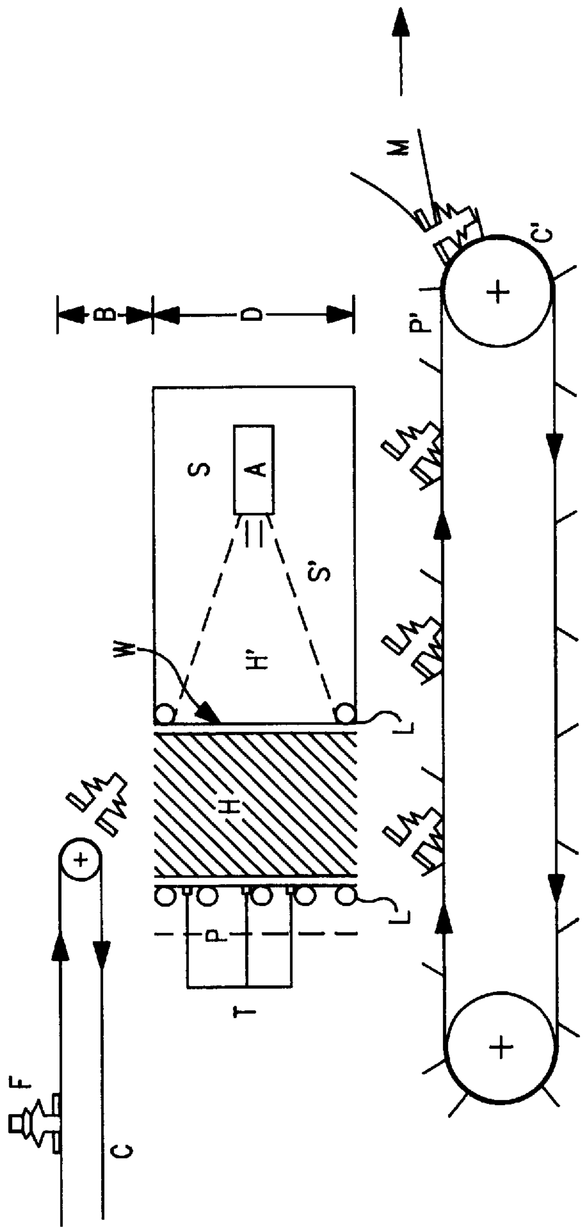
FIG. 1 is a diagram showing the geometry of "contactless" sterilization technique in accordance with the invention.

The principles of product handling are illustrated in FIG. 1 and show the fitment or product F transported by conveyor C to the mouth of the hohlraum cavity H, typically cylindrical, illuminated with energetic electrons passing through window W from accelerator A. This window may be illuminated from a scanner $S^1$ and horn $H^1$, or it may be illuminated directly by a curtain type, pulsed or d.c. electron processor. The free-fall distance from the end of conveyor C to the cavity entrance will determine the entrance velocity v, of the product while in free-fall, and the exit velocity will be determined by the cavity length D. Convoluted transport of the product from C to the cavity entrance may be used to simplify radiation shielding, while the same technique can be employed at the exit of cavity H.

A laminar flow of nitrogen injected through the cavity walls may be used to maintain product motion near the longitudinal symmetry axis of the cavity. Coolant pipes P may be used if required, to dissipate the electron beam energy deposited in the reflective liner L. Continuous monitoring of the electron beam characteristics (energy, dose rate, uniformity) injected into the cavity at window plane W is achieved with a real time radiation monitor, for example of the type described by Nablo, Kneeland and McLaughlin (Nablo, S. V., Kneeland, D. R. and McLaughlin, W. L., "Real Time Monitoring of Electron Processors", Jour. Rad. Phys. Chem. 44 (1995)). It is also practicable to elevate the product's residence time in the treatment zone or cavity with the use of a counterstreaming (vertical) flow of nitrogen or air to reduce the free-fall acceleration and average transit velocity of the product.

From this point the product is carried on conveyor $C^1$, by means of planchets $P^1$ if necessary, to manipulator M or whatever next step is involved in the fabrication of the product. Typical devices of interest for this type of in-line sterilization are a few cc in volume and a few grams in weight, so that estimates of velocity in free-fall ignoring air drag will be sufficiently accurate to illustrate the principles of the technique taught here.

Figure 2:
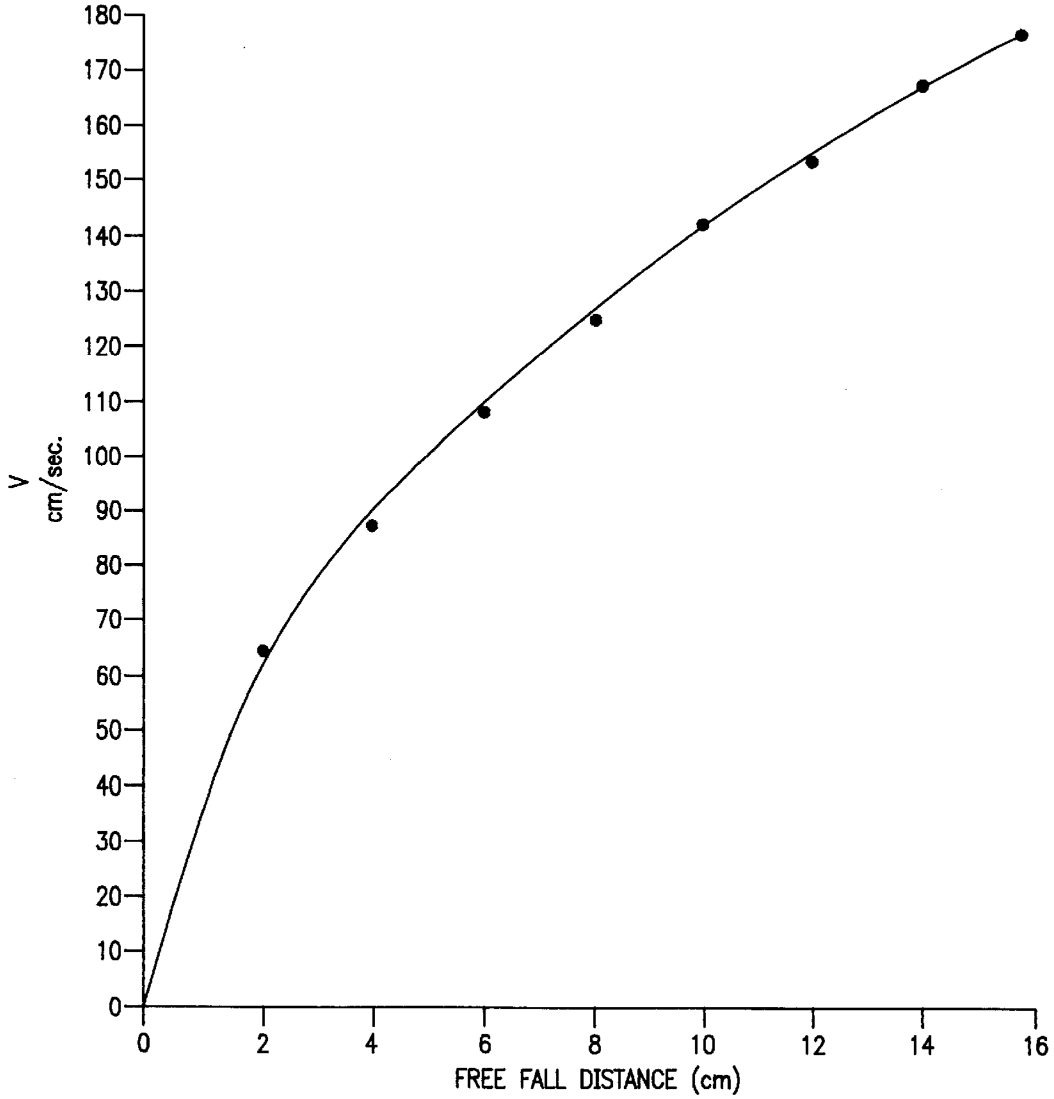
FIG. 2 is a graph showing terminal velocity vs. free-fall distance.

In FIG. 2, the simple entrance velocity v, of a product is shown as a function of free-fall distance B. It is evident that convenient transport velocities of the order of 1 meter/second are available for convenient distances; e.g. 5 cm in earth's gravitational field. Estimates can now be made of system performance for various cavity geometries, but a D (cavity length) value of 10 cm is assumed for purposes of illustration. In this instance, a uniform electron beam procesor window illumination of 5 cm width×10 cm length is assumed, adapted to an 8–10 cm diameter cavity.

Figure 3:
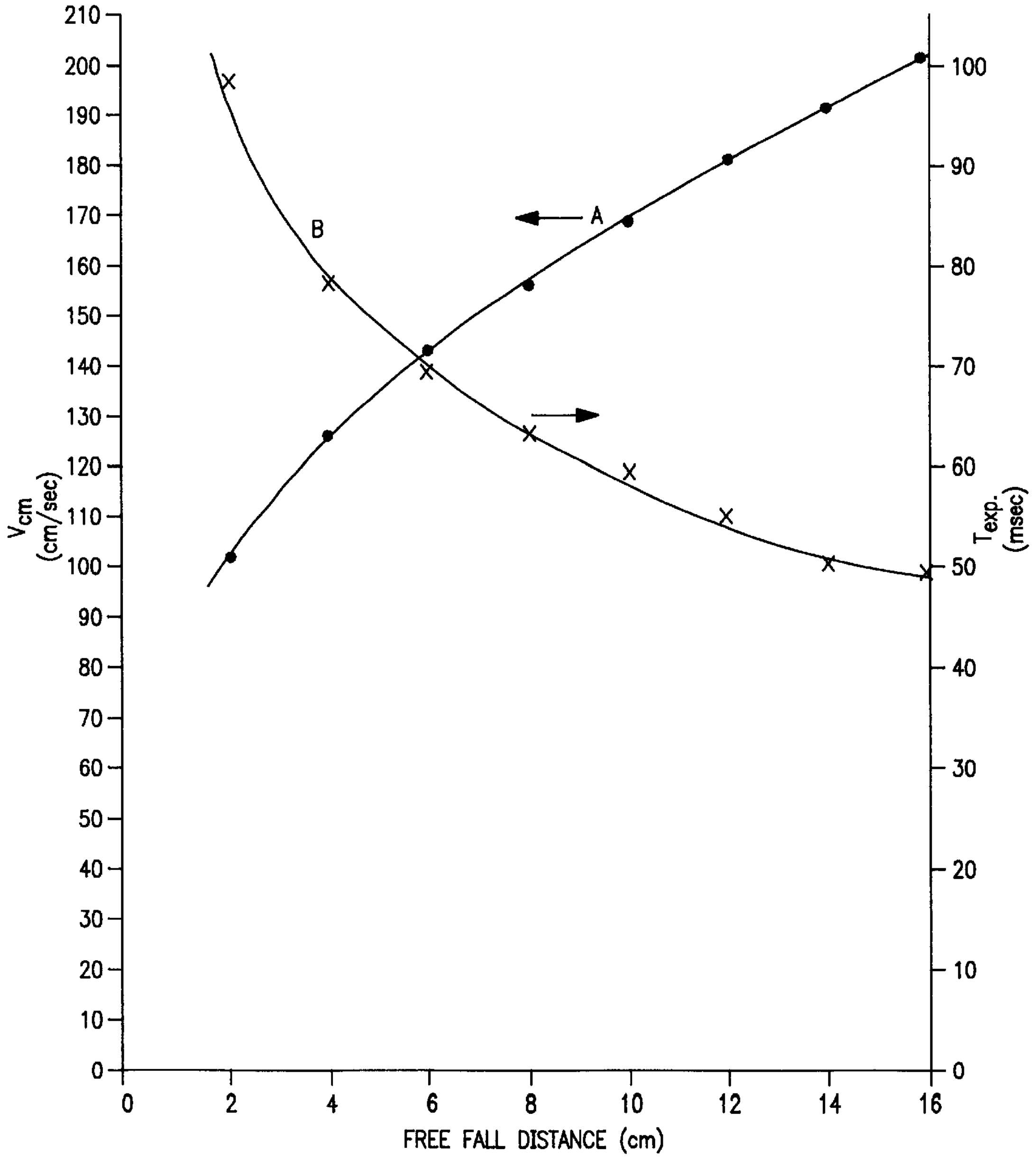
FIG. 3 is a graph showing average velocity and dwell time for a free-fall system with an exposure field of 10 cm. as a function of free-fall distance.

In FIG. 3, data are shown for the cavity system based upon an effective treatment zone of 10 cm along its longitudinal axis. Curve A shows the average velocity of the product in the cavity as a function of free-fall distance B prior to entrance. Curve B shows the dwell time of the product in the 10 cm cavity as a function of free-fall distance B.

Figure 4:
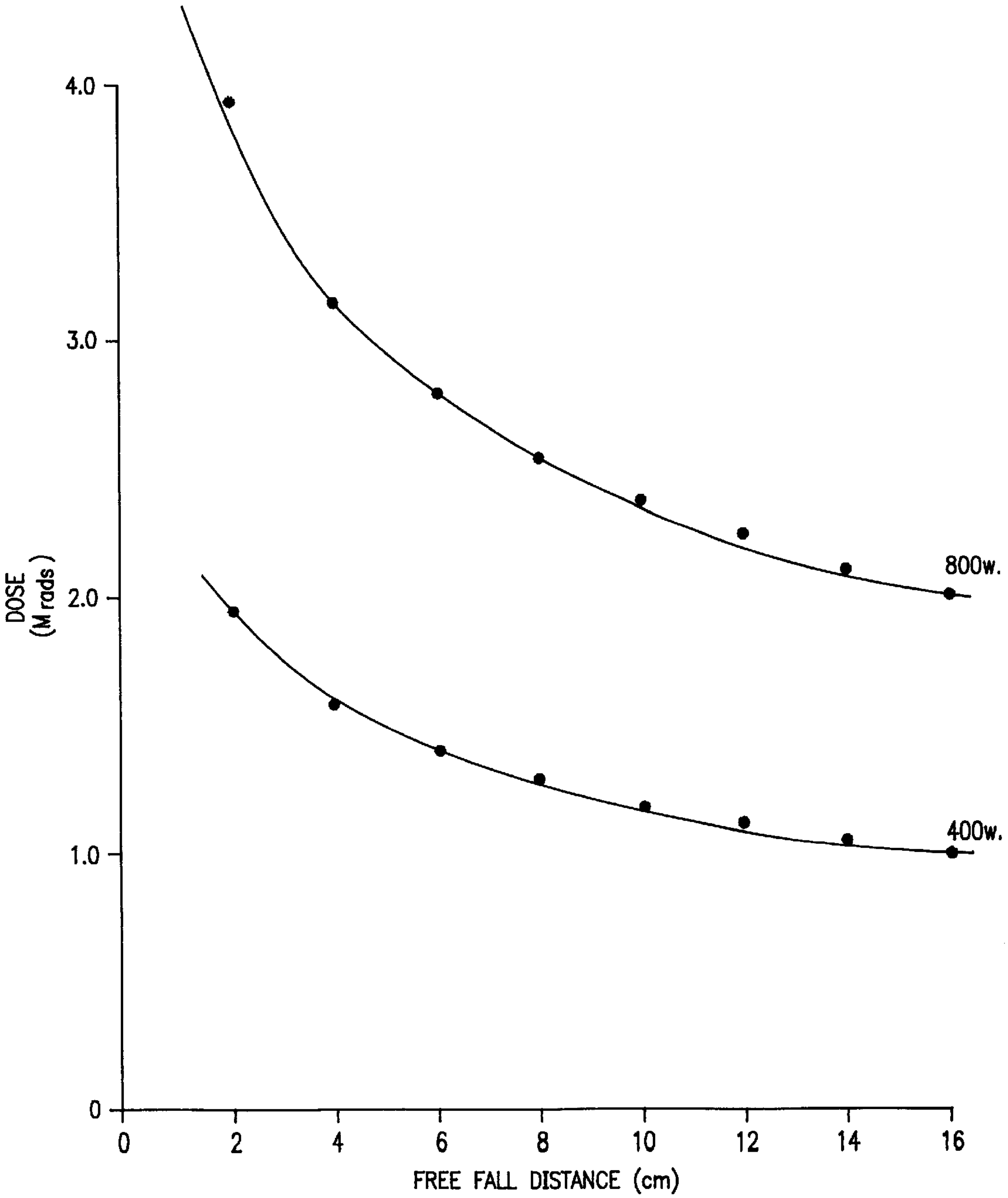
FIG. 4 is a graph showing calculated delivered dose at 400 kV as a function of free-fall distance at beam currents of 1 and 2 ma and an area of 50 cm$^2$.

Based upon an accelerator voltage of 400 kilovolts, it is now possible to calculate the surface dose delivered during free-fall of the product through hohlraum H as a function of entrance velocity; i.e. free-fall distance B. Two operating points are assumed in the data of FIG. 4, one at a beam power of 400 watts (1 ma or 20 $\mu$a/cm$^2$ at the window), and a second at a beam power of 800 watts (2 ma or 40 $\mu$a/cm$^2$ at the window). Even at the lower power level, doses in the 1.5 to 2.0 Megarad range are possible at small distances B, and such doses are typical of those required for the product processes of interest. For example, for discrete products to be sterilized with an assurance level of $10^{-6}$, the requisite doses are specified by the AAMI guidelines (ANSI/AAMI St 31–1990) (Guideline for Electron Beam Radiation Sterilization of Medical Devices, ANSI/AAMI St. 31–1990, Association for the Advancement of Medical Instrumentation, 3330 Washington Boulevard, Suite 400, Arlington, Va. 22201-4598). This treatment or sterilization dose depends upon the average bioburden carried by the product. These surface contamination levels are typically a few colony forming units per device. For example, these guidelines specify 1.52 Megarads for a bioburden of 2 colony forming units per device, and 2.01 Megarads for a bioburden of 50 c.f.u.

Treatment Cavity Design

Using the reflective surface properties reviewed hereinafter, it becomes possible to design a cavity geometry in which the energy (electron beam) is injected radially at one point, and as a result of multiple scattering, the cavity is filled with an isotropic flux of electrons which will suffer several reflections on the average before total absorption. The design of the cavity may reflect the requirements (geometry) of the product passing through it so that the "hohlraum" is most effective for uniform illumination of the product. In view of the relatively large half angles of scatter of the primary electrons in the metallic (usually Titanium) windows used to terminate the vacuum section of the electron processor from the atmospheric environment in which the product moves, the electron beam can be controlled to provide improved product illumination uniformity. For example, with the 10 cm long×15 cm diameter cavity discussed in the following paragraphs, a cooled beam stop can be used to reduce the direct illumination of the front surface of the product passing through it so that the front:rear fluence ratio is reduced. A more convenient approach is to apply a predetermined beam scan raster so that the center to edge current density at the window is tailored to provide a better circumferential fluence distribution around the product. Although circumferential uniformity of a treated product is important, rather large variations are normally tolerable (×2) as long as minimum levels are achieved.

Figure 5:
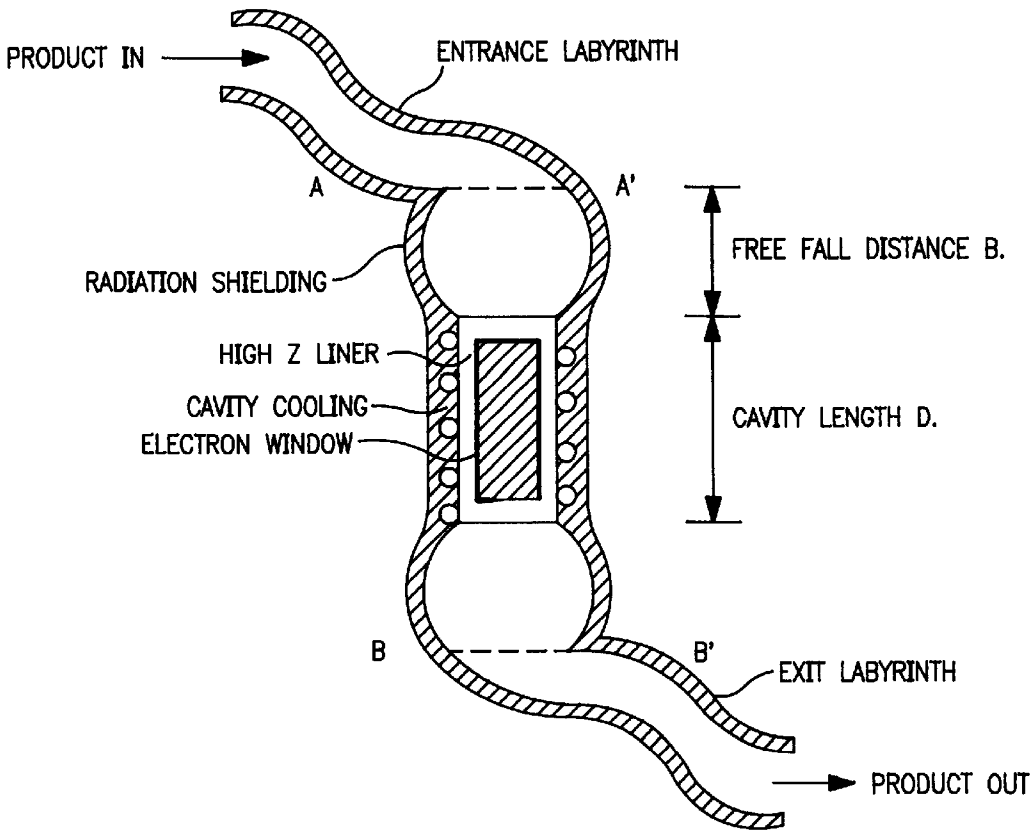
FIG. 5 is a vertical section of a cavity design for free-fall treatment in accordance with the invention.

In the schematic representation of FIG. 5, the cavity walls are water cooled to provide dissipation of the energy not absorbed by the product and delivered to the cavity surfaces. Tantalum has been used in the studies conducted in developing this concept, although other high Z metals such as those of the platinum group (Z=75–79) are well suited to this application.

One of the advantageous features of this cavity design is the ability to trap most of the penetrating x-rays and bremsstrahlung generated by the beam as electrons stop in the cavity walls or in the product.

At elevated energies, these can be significant. For example, in Tantalum the radiation yields; i.e. energy loss in the form of bremsstrahlung, at electron energies of 0.1 and 0.5 Mev are 0.014 and 0.047 respectively, while in polyethylene they are 0.0005 and 0.002 respectively. For very compact pulsed systems, shielding shutters may be used to close off the cavity at planes $AA^1$, and $BB^1$ during treatment and, hence, during the periods of electron illumination and x-ray production in the cavity (see FIG. 5).

The nature of the cavity leads to relatively stagnant air in its interior, especially if closed to convection at the top, so that any Ozone formed there is rapidly recombined at the elevated temperature of 200°–300° C. experienced inside the cavity even with modest beam powers. As a result, the need for inerting of the cavity with Nitrogen flushing, for example, is eliminated except in those instances where Ozone dragged by the product into the region around the cavity poses problems.

In a preferred embodiment of the invention, the energies of the electrons are limited to less than 600 keV so that efficient electron reflection from cavity walls can be realized in a self-shielded geometry—that is, where sufficient high atomic number shielding clad to the apparatus will provide adequate radiation attenuation to permit "unrestricted" operation; i.e. operation where no exclusion area or access restriction for reasons of operator safety, are required.

Various means for adjusting non-uniform illumination of the cavity walls so as to improve the peripheral uniformity of treatment of the object passed through the cavity may be used without departing from the spirit and scope of the invention; for example, such means include stops, magnetic shaping, cooled apertures, parallel beams and programmed scanning, among others.

The treatment cavity forms a treatment zone into which high-energy electrons are directed; it is lined with high atomic number material such as tantalum, gold or uranium so that good isotropy of electron direction results in the treatment zone, for example, in a semi-cylindrical or cylindrical cavity. The orientation of the electron filled cavity (treatment zone) is such that the product can be passed through it ballistically or by pneumatically controlled transfer without any direct or occluding contact with the object to be treated, contact which would otherwise prevent electrons from reaching all surfaces of the object.

The preferred dimensions of the treatment zone are as follows. The treatment zone should be a cylindrical cavity having a diameter at least twice that of the solid/molded product, and with an electron window width of the order of one to two times the cavity radius. The cavity length will be determined by the dose requirements of the process but will typically be 1 to 3 cavity diameters, and the free fall distances at entrance and exit, because of shielding requirements, will be 1 to 2 cavity diameters.

Experimental

In order to demonstrate experimentally the flexibility of the high Z lined cavity for this purpose of electron fluence "flattening" over a geometric surface, experiments were conducted on a 225 kilovolt machine which provides monoenergetic electrons from a 5 cm wide×30 cm long window into a deep conveyor. This electron processor is of the Electrocurtain® design manufactured by Energy Sciences Inc., Wilmington, Mass. The system was used so that a semicylindrical cavity, lined with Tantalum, was oriented with its longitudinal axis across the narrow (5 cm) width of the beam. Studies of the transverse distribution of the beam had shown it to possess a full width at half maximum of 8 cm some 5.4 cm from the window, and 11.5 cm at 8.6 cm from the window. The experiments were performed with the opening to the semi-cylindrical cavity some 6.4 cm from the window and with a cavity length of 10 cm, approximately the beam's half maximum value.

Cylindrical objects (polystyrene syringes) were oriented along the cavity axis and two sample diameters were used (1.0 and 1.4 cm) to study the peripheral (circumferential) dose distributions with and without backscatter. Thin radiochromic film (10 μm thick) was wrapped around the syringe barrels and used to determine the dose distributions for each of the irradiation conditions selected. The syringe diameters selected were considered to be representative of the characteristic dimensions of the molded products and devices for which this technique is most appropriate; i.e. diameters of 1–2 cm and lengths of 1–3 cm.

Figure 7:
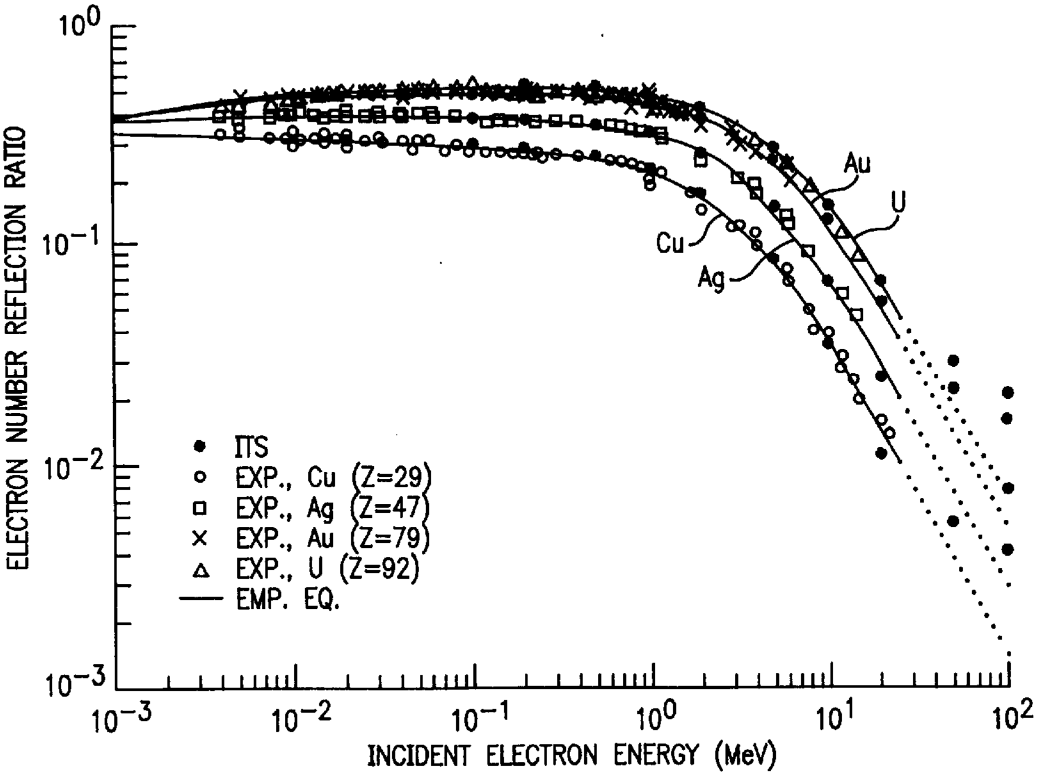
FIG. 7 is a graph showing electron number reflection ratio as a function of incident electron energy.
Figure 8:
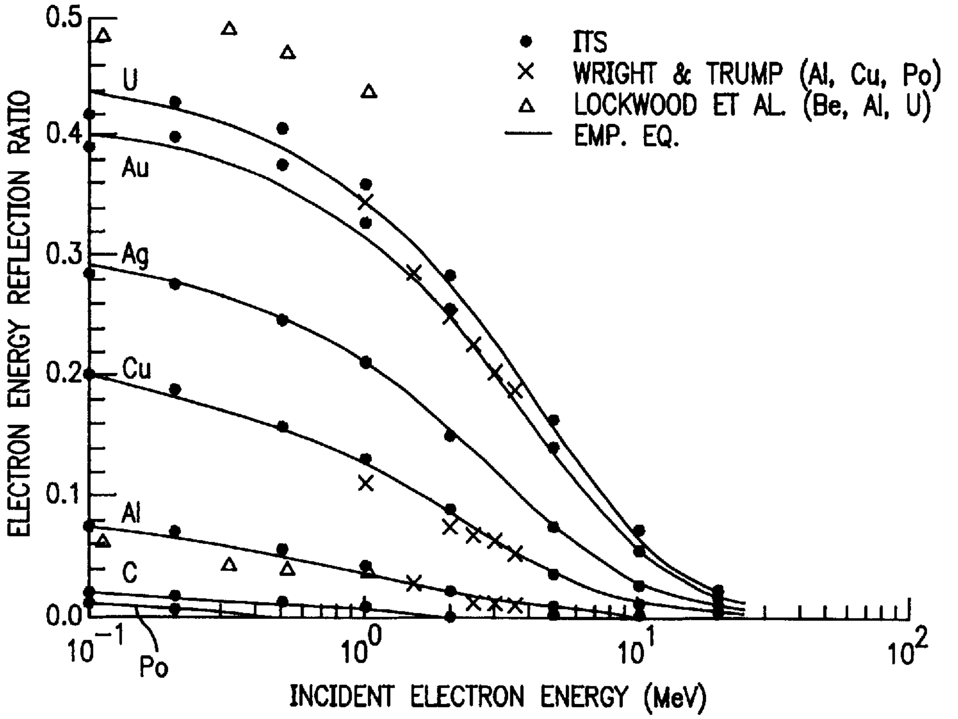
FIG. 8 is a graph showing electron energy reflection ratio as a function of incident electron energy.

The semi cylinder diameter of 5.0 cm was selected because it presents a width some 3 to 5 times that of the actual product diameter, offering the best opportunity for dose flattening with the backscatter coefficients of 0.35 to 0.40 expected from the data of FIGS. 7 and 8.

Figure 6:
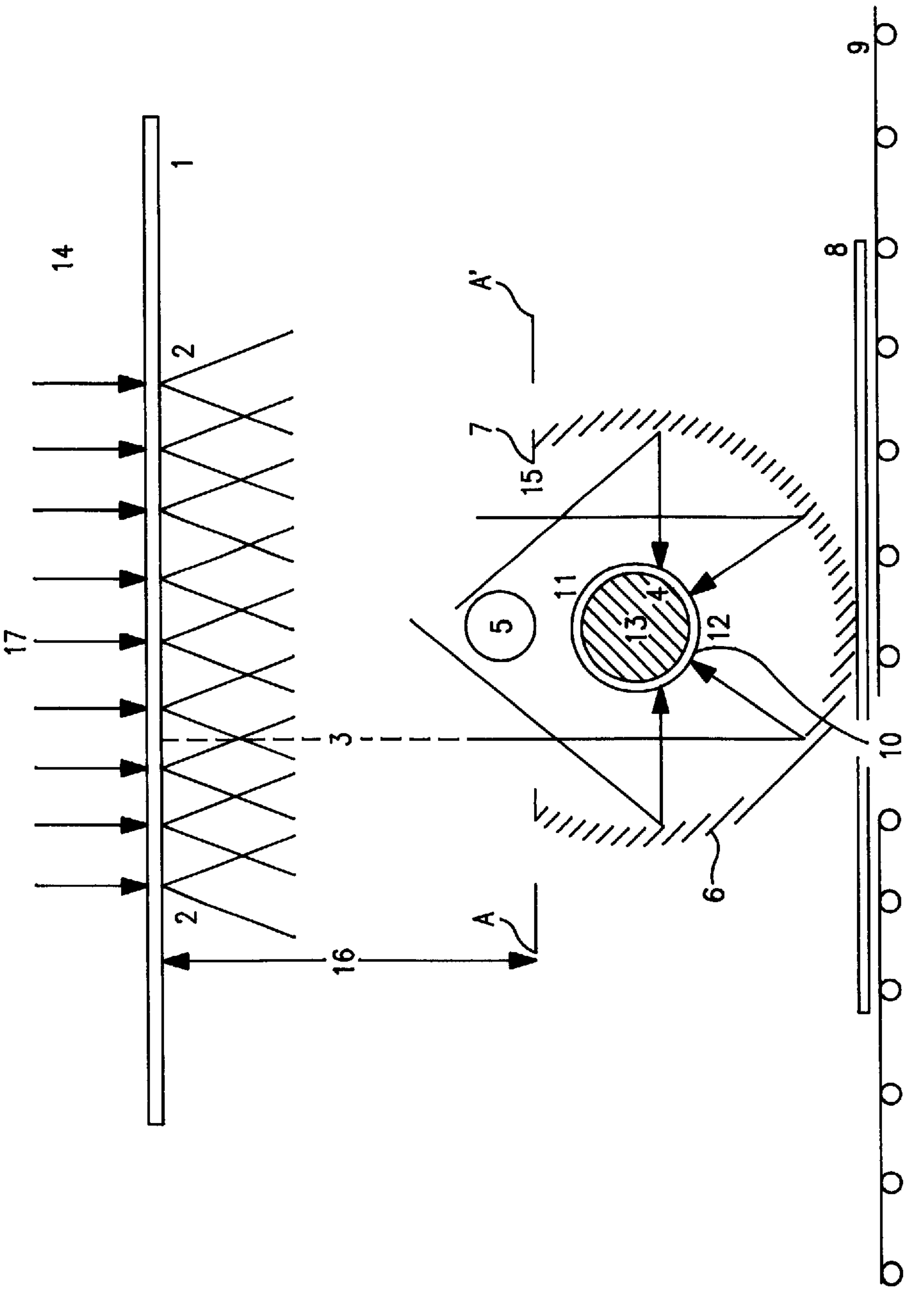
FIG. 6 is a schematic of the configuration used in experimental geometry for electron fluence flattening demonstration.

A schematic of the configuration used is shown in FIG. 6 and was designed to provide a simulator of the product:cavity:beam geometry for the "free-fall" case taught here, which would use a vertically oriented beam.

As shown in FIG. 6, the cavity access opening 15 of 4.7 cm is located 6.4 cm (distance 16) from window surface of the electron processor whose 15 μm titanium window gives a half angle of scatter 2 of some 30° to the energetic electrons 17 at these energies used (225 keV). The electrons emerge from vacuum region 14 and continue to scatter in the air filled or Nitrogen purged flight path 3 until they reach exemplar 4, beam stop 5 or cavity 6. The 5 cm diameter cavity 6 used here was made of pvc, and could be lined with Ta foil 7 (150 μm thickness). The cavity was fixed on plate 8 for positioning on the static conveyor chain 9. Thin film dosimeters 10 were mapped helically on exemplar 4 to provide at least 3 or 4 full circumferential maps of the surface, with 0° taken as top dead center 11 and 180° as the bottom of the device 12 facing the most occluded region of the cavity wall.

Exemplar 4 could be easily removed for dosimeter mounting or removal, and its longitudinal axis of symmetry 13 was positioned to be that of the cavity 6.

Beam stops 5 consisted of cylindrical rods which were supported at cavity entrance plan $AA^1$. Their diameters could be selected to adjust the percentage of the electron flux delivered across access opening 15 which could reach the cavity reflective liner, and to simultaneously adjust the ratios of the "direct" fluence at 0° (11) to the "indirect" fluence at 180° (12).

Some typical data taken with the arrangement of FIG. 6 are shown in table 1. The ratio of doses recorded at 180° (12) to those at 0° (11) are shown in column 5. The addition of the Tantalum backscatter foil doubles the fluences recorded at location 12 from 14% to 30% of those recorded at location 11. The addition of stop 5 is increasingly effective as its diameter is increased from 7 to 35 percent that of the cavity opening width. This arrangement simulates the effect: of such a programmed scan discontinuity in a two dimensional scanned electron beam, of such a physical stop in a continuous curtain beam or, of an electron optically divided distribution in a continuous beam; i.e. parallel divided beams directly illuminating such a cavity with or without stops.

The results of table 1 demonstrate the efficacy of the backscatter, cavity technique for flattening the dose (electron fluence) distribution around solid or convoluted objects. The elevation of these dose ratios to 50% or more is entirely adequate for most electron processing applications. In fact, the 30% figure is adequate without resorting to any injected flux distribution modification in that most processes of interest will accommodate a 3:1 dose ratio variation across the product's surface, as long as the minimum dose levels required by the process are satisfied.

TABLE 1

Dose Data for the Cavity Geometry

| Run # | Product Diameter | Cavity Wall | Beam Stop | 180°–0° Ratio |
|---|---|---|---|---|
| 1 | 1.0 cm | pvc | None | 0.14 |
| 2 | 1.0 cm | Ta | None | 0.30 |
| 3 | 1.35 cm | pvc | None | 0.14 |
| 4 | 1.35 cm | Ta | None | 0.29 |
| 5 | 1.35 cm | Ta | 3.5 mm o.d. | 0.37 |
| 6 | 1.35 cm | Ta | 7.5 mm o.d. | 0.45 |
| 7 | 1.35 cm | Ta | 12.5 mm o.d. | 0.52 |
| 8 | 1.35 cm | Ta | 16.5 mm o.d. | 0.58 |

Electron Reflection

When energetic electrons impinge on a solid target, a portion of the incoming energy is reflected from the target surface. Most of this energy is carried by electrons whose direction of motion was altered by more than 90° due to multiple scattering of the primary electrons with electrons in the atoms of the target. This reflection coefficient or number of scattered electrons per incident electron is dependent upon electron density in the target, which of course controls the probability of electron-electron scatter. This density varies the atomic number of the target so is very low for the hydrocarbons (primarily H and C) and rises rapidly for the heavier metals. Knowledge of these reflection coefficients is very important in the diagnosis and application of electron beams and both the number reflection ratios $\eta_N$ and energy reflection ratios $\eta_E$ have been studied extensively over a broad range of energies and Z (atomic number) values.

Tabata et al (Tabata, T., Ito, R. and Okabe, S., "An empirical equation for the backscattering coefficient of electrons", Nucl. Instrum. and Methods 94, 509–513, (1971)) summarized the available data from 50 keV to 22 Mev and derived an empirical equation for the derivation of $\eta_n$. Soum et al (Soum, G., Ahmed, H., Pinna, H. and Verdier, P., "Transmission and backscatter of electrons of high energy", Rev. Phys. App. 20, 823–829, (1985) and Soum, G., Mousselli, A., Arnal, F. and Verdier, P., "Study of the transmission and backscatter of electrons of energy 0.05 to 3 Mev. in the multiple scattering domain", Rev. Phys, App 22, 1189–1209, (1987)) reported new data over the 50 keV to 3 Mev regime of greatest interest for electron processing. More recently, Halbleib et al (Halbleib, J. A., Kensek, R. P., Melhorn, T. A., Valdez, G., Seltzer, S. M. and Berger, M. J., ITS version 3.0; The Integrated TIGER Series of coupled electron/photon Monte Carlo transport codes. Report SAND 91–1634, Sandia Nat. Labs, Albuquerque, N.M.) (1993), used the TIGER Monte-Carlo code to calculate $\eta_N$ and $\eta_E$ over the energy range from $1–10^5$ kev, and Tabata et al (Ito, R., Andreo, P. and Tabata, T., "Reflection of Electrons and Photons from Solids Bombarded by 0.1–100 Mev Electrons", Radiat. Phys. Chem. 42, #4–6, 761–764, (1993)) have used a least squares fit to all the experimental data available, including the TIGER code predictions of Halbleib et al, over the Z range from Al (Z=8) to U (Z-92). Results for the electron number reflection ratio $\eta_N$ for the higher Z values are shown in FIG. 7, while the electron energy reflection ratio $\eta_E$ is shown in FIG. 8. Here the reflection ratio is defined as the ratio of the total energy of backscattered electrons to the total incident energy.

It is evident from FIG. 7 that very high reflection coefficients in the 0.45–0.50 range are observed for Z values above 75, and that this performance remains quite flat over the energy range of major interest for electron processing; i.e. 0.01–1.0 Mev. At higher energies, reduction of albedo results from deeper penetration of the primaries and reduced probability of reflected electron escape from or return to the surface of incidence.

A similar behavior is observed in the data of FIG. 8 in that at the energies of immediate interest for sterilization; i.e. 0.1–0.5 Mev., these energy reflection ratios are large and relatively flat. For example, for U, the values vary from 0.44 to 0.40 respectively (or only 10%) and for Au, 0.41 to 0.36 respectively. These data show that the use of a practical electron reflector geometry at these elevated Z values can provide a relatively flat and predictable yield over a broad energy range, e.g.x5, typical of the dynamic range of most modern electron processors.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

I claim:

1. Method of irradiating a product with electrons, comprising the following steps:

directing high-energy electrons into a treatment zone at atmospheric pressure lined with high atomic number material so that a high anisotropy of electron direction results in the treatment zone, and orienting said treatment zone so that said product can be passed through it in free-fall without any direct or occluding contact with said product, which contact would otherwise prevent electrons from reaching all surfaces of said product.

2. Method in accordance with claim 1, wherein said high atomic number material is selected from the group consisting of tantalum, gold and uranium.

3. Method in accordance with claim 1, wherein said treatment zone is a semi-cylindrical or cylindrical cavity.

4. Method in accordance with claim 1, wherein said product is passed through said treatment zone ballistically or by pneumatically controlled transfer.

5. The method of claim 1, wherein said product is a discrete, three-dimensional object.

6. The method of claim 1, wherein said product has a contoured, molded surface.

7. Apparatus for irradiating a product with electrons, said product having a contoured, molded surface, said apparatus comprising in combination a cavity defined by a wall having an electron window, said cavity being maintained at atmospheric pressure, means for releasing said product having said contoured, molded surface at a point above said cavity so that it falls in free-fall through said cavity with a known entrance velocity and a known exit velocity, and means for directing high energy electrons through said electron window.

8. Apparatus according to claim 7, wherein said wall is lined with high Z material.

9. Apparatus according to claim 7, wherein convoluted paths for said product are provided at both entrance and exit of the cavity to reduce the probability of scattered radiation reaching the region external to the apparatus.

10. Apparatus according to claim 7, wherein said means for directing high energy electrons into the treatment zone includes means for adjusting non-uniform illumination of the cavity walls so as to improve the peripheral uniformity of treatment of the object passed through the cavity.

11. Apparatus according to claim 10 in which the energies are limited to less than 600 keV so that efficient electron reflection from cavity walls can be realized in a self-shielded geometry.

12. Apparatus according to claim 10, wherein said means for rendering the electron distribution non-uniform in the cavity to optimally irradiate the product surface comprises stops, magnetic shaping or the like.

13. The apparatus of claim 7, wherein said product is a discrete, three-dimensional object.

* * * * *